(12) United States Patent
Murakami

(10) Patent No.: US 11,627,682 B2
(45) Date of Patent: Apr. 11, 2023

(54) RACK-MOUNTED DEVICE AND ELECTRONIC APPARATUS

(71) Applicant: FUJITSU LIMITED, Kawasaki (JP)

(72) Inventor: Hajime Murakami, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/782,242

(22) Filed: Feb. 5, 2020

(65) Prior Publication Data

US 2020/0275578 A1 Aug. 27, 2020

(30) Foreign Application Priority Data

Feb. 26, 2019 (JP) .............................. JP2019-033226

(51) Int. Cl.
*H05K 7/18* (2006.01)

(52) U.S. Cl.
CPC .................................. *H05K 7/183* (2013.01)

(58) Field of Classification Search
CPC ........ H05K 7/183; H05K 7/18; H05K 5/0021; H05K 7/14
See application file for complete search history.

(56) References Cited

U.S. PATENT DOCUMENTS

| | | | | |
|---|---|---|---|---|
| 5,305,180 A * | 4/1994 | Mitchell | ............... | G06F 1/1616 361/679.37 |
| 7,092,245 B2 * | 8/2006 | Shih | ....................... | H05K 1/144 174/260 |
| 7,864,519 B2 * | 1/2011 | Lin | ....................... | G11B 33/128 361/679.33 |
| 8,964,371 B2 * | 2/2015 | Hou | ......................... | H05K 5/02 361/679.37 |
| 9,001,514 B2 * | 4/2015 | Rust | ..................... | G11B 33/128 361/727 |
| 9,167,705 B2 * | 10/2015 | Kyle | .................... | H05K 5/0217 |
| 9,247,667 B2 * | 1/2016 | Sato | ..................... | H05K 7/1421 |
| 9,280,186 B2 * | 3/2016 | Yang | .................... | H05K 7/1487 |
| 9,497,881 B2 * | 11/2016 | Chen | .................... | H05K 7/1487 |
| 10,123,446 B1 * | 11/2018 | Hou | ..................... | H05K 7/1487 |

(Continued)

FOREIGN PATENT DOCUMENTS

| JP | 2002-290082 A | 10/2002 |
|---|---|---|
| JP | 2006-24283 A | 1/2006 |

(Continued)

OTHER PUBLICATIONS

Office Action dated Sep. 6, 2022, issued in counterpart JP application No. 2019-033226, with English translation (6 pages).

(Continued)

*Primary Examiner* — Abhishek M Rathod
*Assistant Examiner* — Keith DePew
(74) *Attorney, Agent, or Firm* — WHDA, LLP

(57) ABSTRACT

A rack-mounted device includes a case configured to include, in a width direction, a plurality of containment rooms each in which an electronic device is contained, a partition suspended from an upper wall of the case and configured to partition off the plurality of containment rooms adjacent to each other and guide the electronic device, and a support plate extending from a sidewall of the case into a containment room of the plurality of containment rooms and provided with a gap from a lower wall of the case to support the electronic device.

20 Claims, 13 Drawing Sheets

(56) References Cited

U.S. PATENT DOCUMENTS

| | | | |
|---|---|---|---|
| 10,168,747 B2* | 1/2019 | Zhu | H05K 7/1489 |
| 2002/0131242 A1* | 9/2002 | Nagasawa | G11B 33/125 |
| | | | 361/727 |
| 2005/0105265 A1* | 5/2005 | Petrov | G11B 33/128 |
| | | | 361/679.33 |
| 2006/0010456 A1 | 1/2006 | Ishimine et al. | |
| 2011/0174815 A1 | 7/2011 | Katano | |
| 2014/0126129 A1* | 5/2014 | Kyle | H05K 7/18 |
| | | | 361/679.02 |
| 2018/0157295 A1* | 6/2018 | Zhu | G06F 1/187 |
| 2018/0303004 A1* | 10/2018 | Zhai | G06F 13/4068 |
| 2018/0317338 A1* | 11/2018 | Yu | H05K 7/1487 |
| 2019/0075677 A1* | 3/2019 | Ehlen | H05K 7/1492 |
| 2020/0154591 A1* | 5/2020 | Zhai | G06F 13/4068 |

FOREIGN PATENT DOCUMENTS

| | | |
|---|---|---|
| JP | 2008-47748 A | 2/2008 |
| JP | 2011-150488 A | 8/2011 |

OTHER PUBLICATIONS

Office Action dated Feb. 21, 2023, issued in counterpart JP application No. 2019-033226, with English translation. (8 pages).

* cited by examiner

RACK-MOUNTED DEVICE AND ELECTRONIC APPARATUS

CROSS-REFERENCE TO RELATED APPLICATION

This application is based upon and claims the benefit of the prior Japanese Patent Application No. 2019-033226, filed on Feb. 26, 2019, the entire contents of which are incorporated herein by reference.

FIELD

The embodiments discussed herein are related to a rack-mounted device and an electronic apparatus.

BACKGROUND

There is a rack-mounted device such as a server device contained in a rack (see, e.g., Japanese Laid-open Patent Publication Nos. 2008-047748 and 2006-024283). The rack-mounted device is contained in multiple tiers in the height direction of the rack. Further, each rack-mounted device contains a plurality of electronic units.

Related techniques are disclosed in, for example, Japanese Laid-open Patent Publication Nos. 2008-047748 and 2006-024283.

SUMMARY

According to an aspect of the embodiments, a rack-mounted device includes a case configured to include, in a width direction, a plurality of containment rooms each in which an electronic device is contained, a partition suspended from an upper wall of the case and configured to partition off the plurality of containment rooms adjacent to each other and guide the electronic device, and a support plate extending from a sidewall of the case into a containment room of the plurality of containment rooms and provided with a gap from a lower wall of the case to support the electronic device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

When a lower wall portion of a rack-mounted device bends downward due to the weight of an electronic unit (for an example, electronic device), the lower wall portion may interfere with a rack-mounted device underneath the lower end thereof.

As a countermeasure, for example, it is conceivable to increase the containment interval in the height direction of the rack-mounted device inside a rack. However, when the containment interval in the height direction of the rack-mounted device is increased, the containment area for the rack-mounted device in the rack is reduced.

Hereinafter, an embodiment of the technology to reduce the bending of the lower wall portion of the rack-mounted device will be described.

[Electronic Apparatus]

Figure 1:
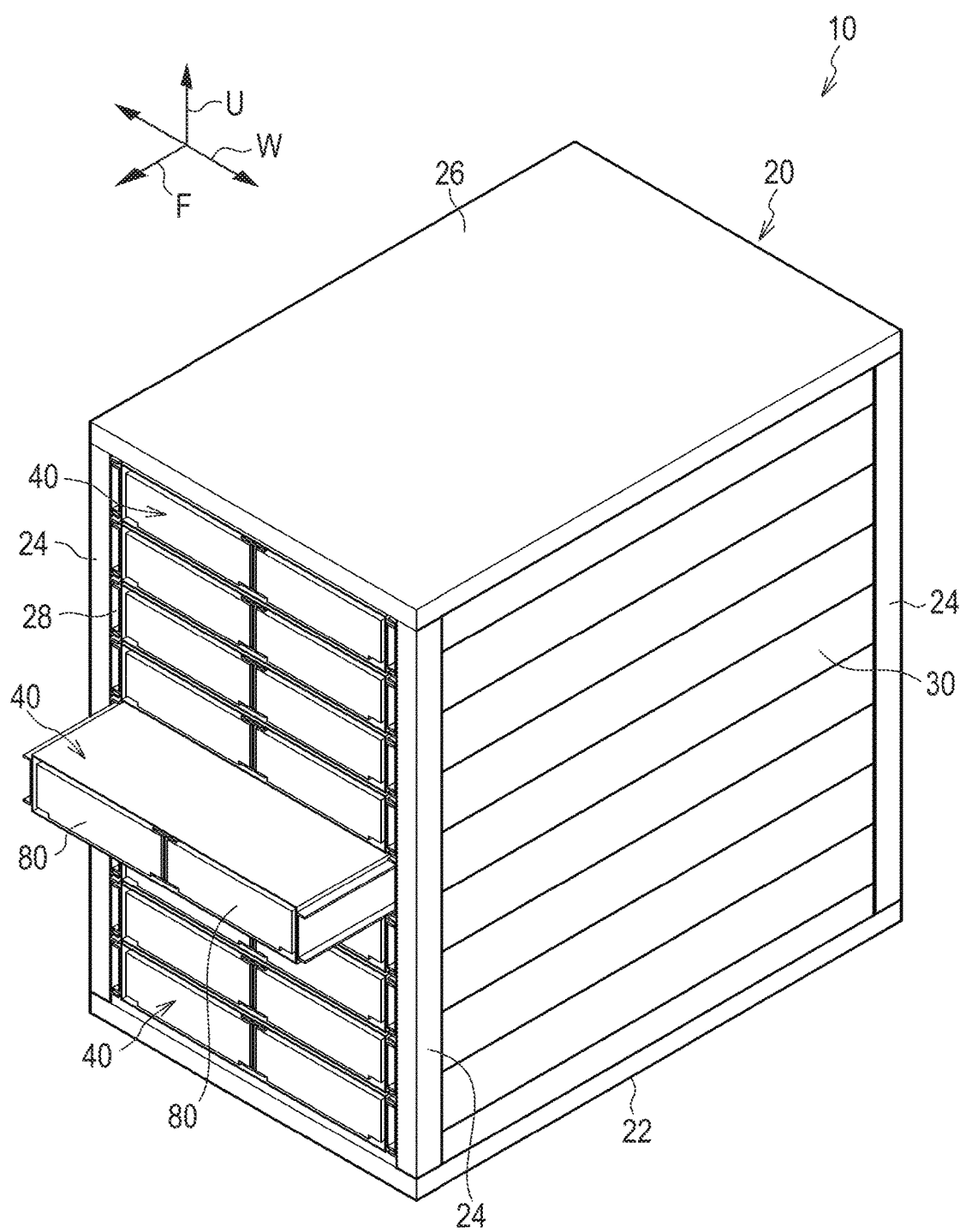
FIG. 1 is a perspective view illustrating an electronic apparatus according to an embodiment.

FIG. 1 illustrates an electronic apparatus 10 according to an embodiment. The electronic apparatus 10 includes a rack 20 and a plurality of rack-mounted devices 40.

In addition, an arrow F appropriately illustrated in each drawing indicates the front side (front side in the longitudinal direction) of the rack 20 and the rack-mounted device 40. Further, an arrow W indicates the width direction of the rack 20. Furthermore, an arrow U indicates the upper side (upper side in the height direction) of the rack 20 and the rack-mounted device 40.

[Rack]

The rack 20 includes a bottom plate 22, four columns 24, and a top plate 26. The bottom plate 22 is formed in a rectangular shape and is provided on, for example, a floor installation surface. The columns 24 are erected on the respective corners of the bottom plate 22. For example, the four columns 24 are formed of a metal member having an L-shaped cross section. The top plate 26 having a rectangular shape is placed on these columns 24.

A mounting port 28 is formed in the front surface (surface on the arrow F side) of the rack 20 to communicate with the inside of the rack 20. The plurality of rack-mounted devices 40 are contained inside the rack 20 from the mounting port 28. The plurality of rack-mounted devices 40 are contained in multiple tiers in the height direction of the rack 20 (direction indicated by the arrow U). In addition, the mounting port 28 may be formed in the rear surface of the rack 20.

Figure 2:
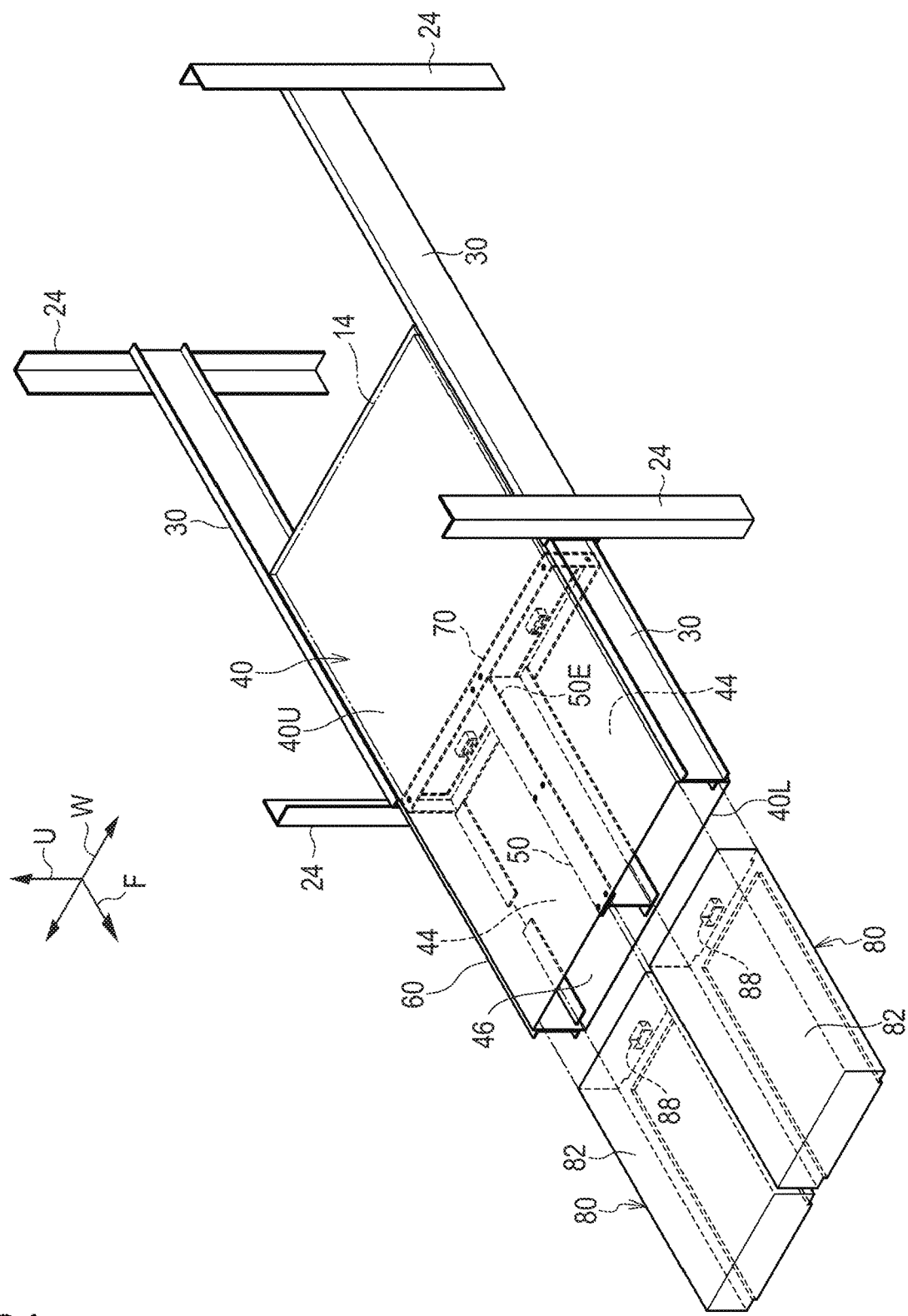
FIG. 2 is a perspective view illustrating a rack-mounted device illustrated in FIG. 1.

As illustrated in FIG. 2, a pair of guide rails 30 are provided on both sides in the width direction of the rack 20 to slidably support the rack-mounted devices 40 and guide the rack-mounted devices 40 to the inside of the rack 20. The pair of guide rails 30 are arranged along the longitudinal direction of the rack 20. Each guide rail 30 extends between the column 24 on the front side and the column 24 on the rear side of the rack 20.

Figure 3:
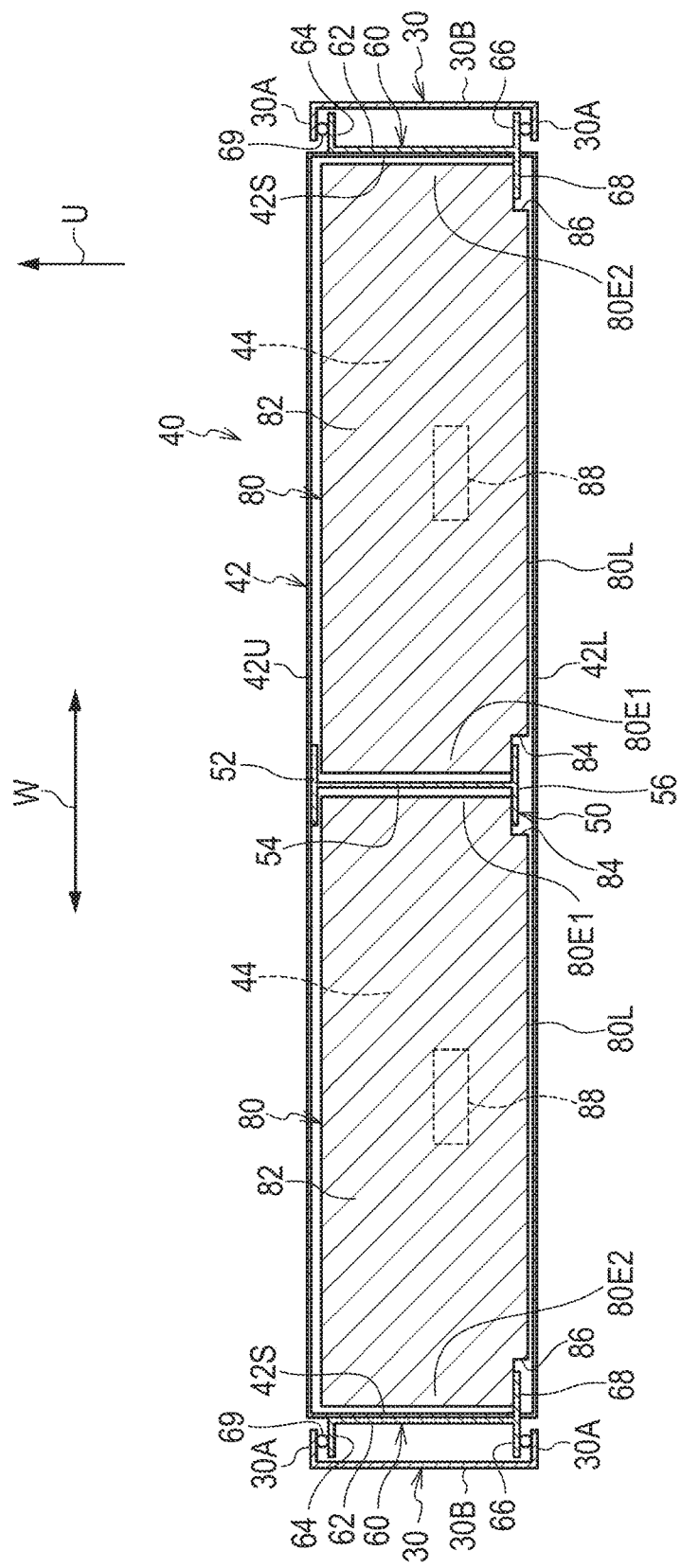
FIG. 3 is a cross-sectional view taken along line 3-3 of FIG. 4.

As illustrated in FIG. 3, each guide rail 30 is formed of a metal member having a C-shaped cross section. The guide rail 30 includes a pair of flange portions 30A and a web portion 30B. The pair of flange portions 30A face each other in the height direction of the rack 20. The web portion 30B interconnects the pair of flange portions 30A.

[Rack-Mounted Device]

As illustrated in FIG. 2, the rack-mounted device 40 includes a case 42 (see FIG. 3) and a plurality of electronic units 80 (for example, a plurality of electronic devices). The case 42 is formed in a flat box shape. As illustrated in FIG. 3, the case 42 includes an upper wall portion 42U, a lower wall portion 42L, and a pair of sidewall portions 42S. The upper wall portion 42U and the lower wall portion 42L face each other in the height direction of the case 42. The pair of sidewall portions 42S face each other in the width direction of the case 42. Further, the pair of sidewall portions 42S interconnect the upper wall portion 42U and the lower wall portion 42L.

Figure 4:
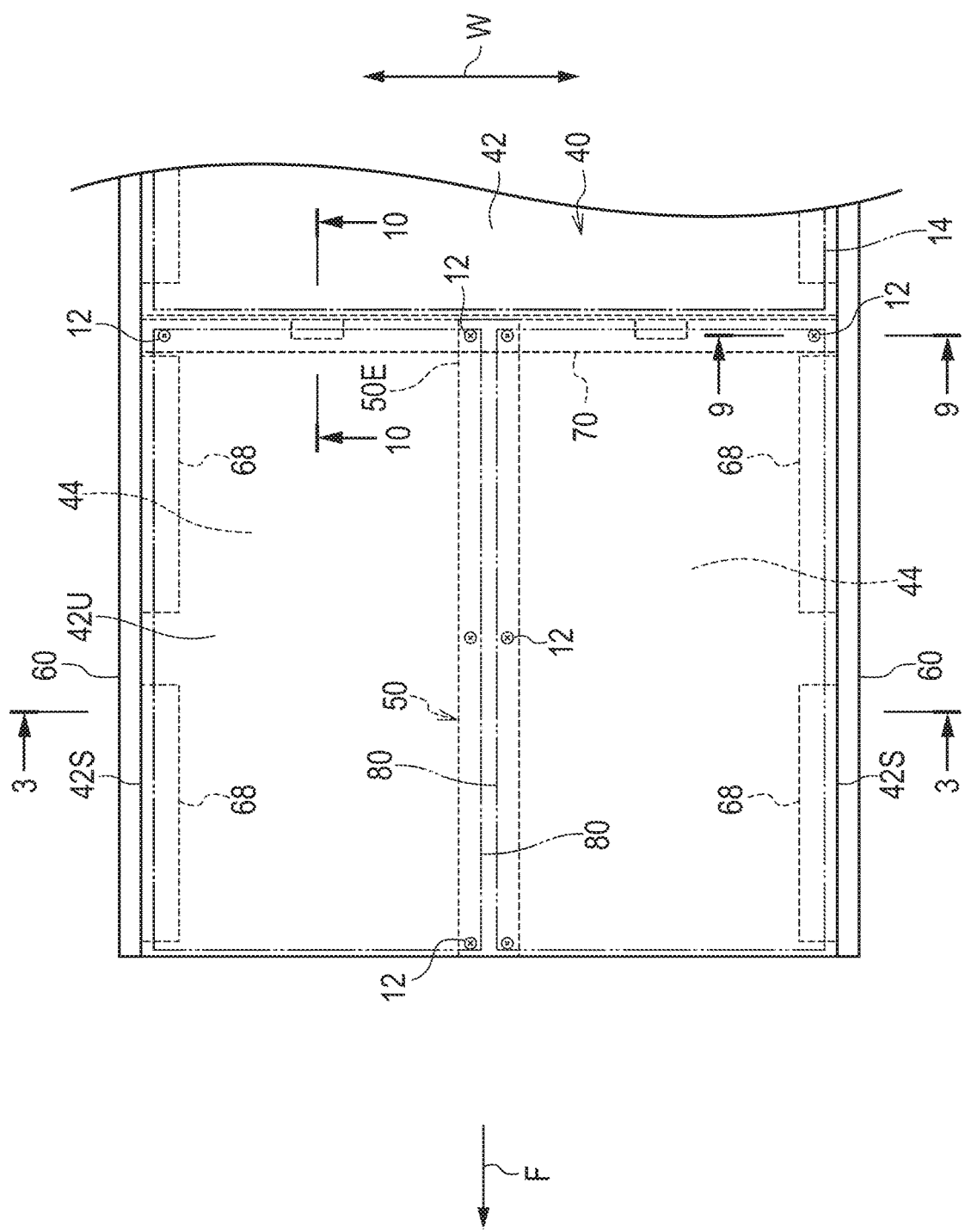
FIG. 4 is a plan view illustrating the front side of the rack-mounted device illustrated in FIG. 2.

As illustrated in FIGS. 2 and 4, a plurality of containment rooms 44 are provided at the front side (arrow F side) of the case 42. The plurality of containment rooms 44 are arranged side by side in the width direction of the case 42. Further, a containment port 46 (see FIG. 2) is formed in the front surface of the case 42 (surface on the arrow F side) to communicate with the plurality of containment rooms 44. The electronic units 80 are contained in the respective containment rooms 44 so as to be dischargeable from the containment port 46.

In addition, for example, another electronic unit 14 is contained at the rear side of the case 42.

[Partition Member]

As illustrated in FIG. 4, a partition member 50 is provided at the front side of the case 42 to partition the plurality of containment rooms 44 and guide the electronic units 80 into the containment rooms 44. The partition member 50 extends in the longitudinal direction of the case 42 and is disposed at the center in the width direction of the case 42. Further, as illustrated in FIG. 3, the partition member 50 is suspended from the upper wall portion 42U of the case 42. The front side of the case 42 is partitioned into two containment rooms 44 by the partition member 50.

Figure 5:
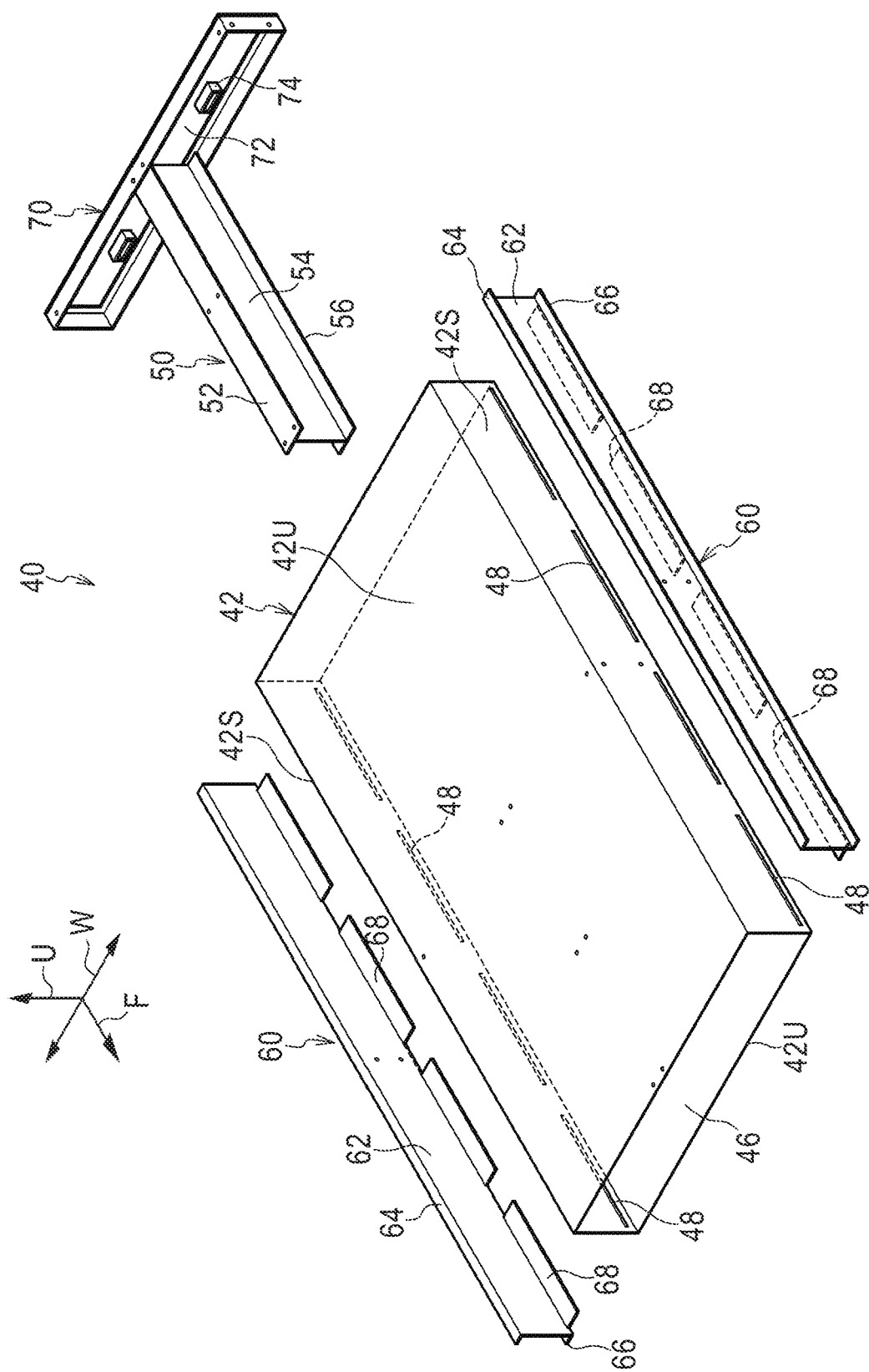
FIG. 5 is an exploded perspective view illustrating the rack-mounted device illustrated in FIG. 4.
Figure 6:
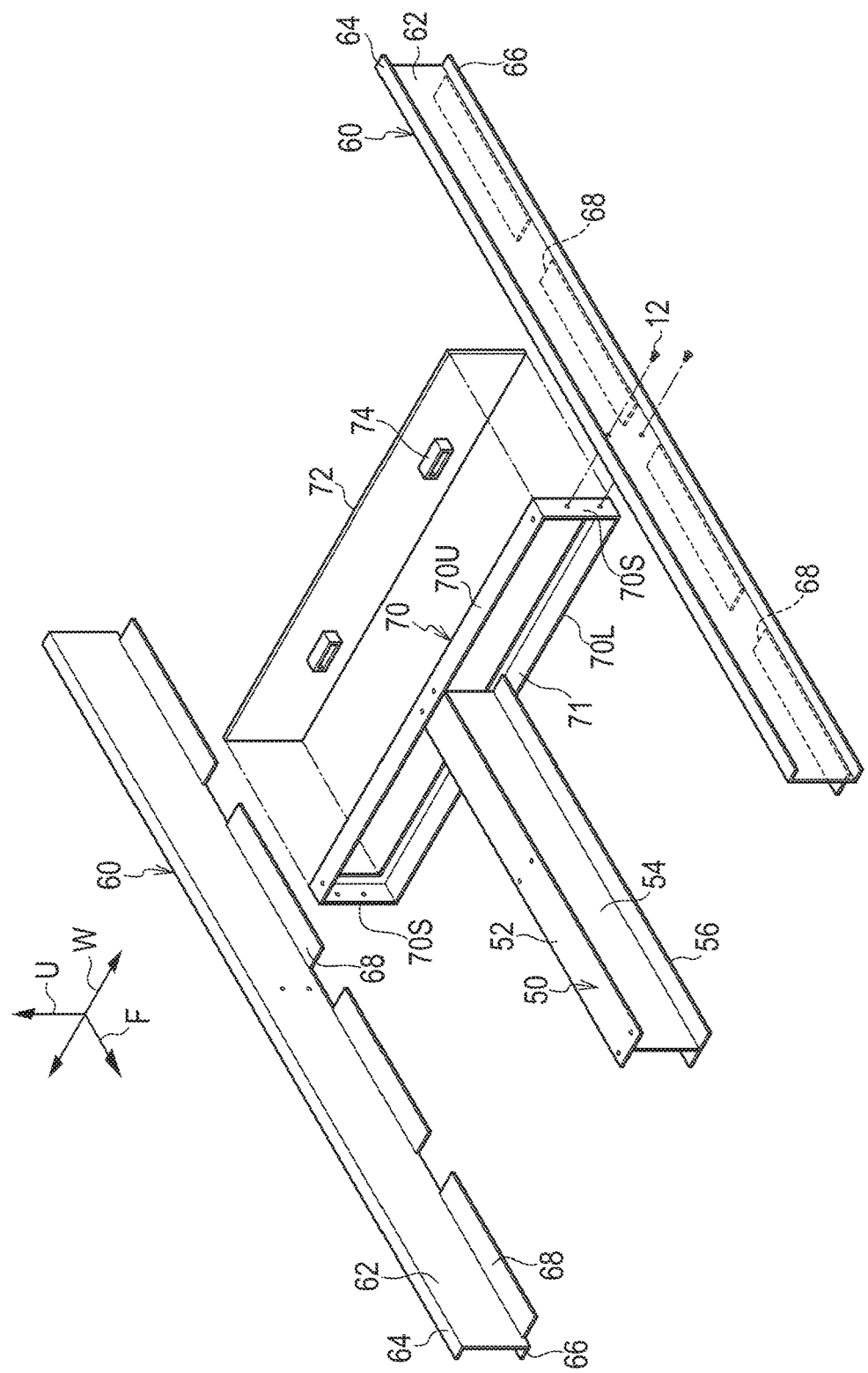
FIG. 6 is an exploded perspective view illustrating a connecting member, a substrate, and a guide member illustrated in FIG. 5.

As illustrated in FIGS. 5 and 6, the partition member 50 is formed of a metal member having an H-shaped cross section. The partition member 50 includes a flange portion 52, a partition wall portion 54, and a support portion 56.

As illustrated in FIG. 3, the flange portion 52 is joined by, for example, a screw 12 in a state where the flange portion 52 is superimposed on the lower surface of the upper wall portion 42U of the case 42. The partition wall portion 54 extends downward from the center in the width direction of the flange portion 52. The plurality of containment rooms 44 are partitioned by the partition wall portion 54. Further, the support portion 56 is provided on the lower end of the partition wall portion 54.

Figure 7:
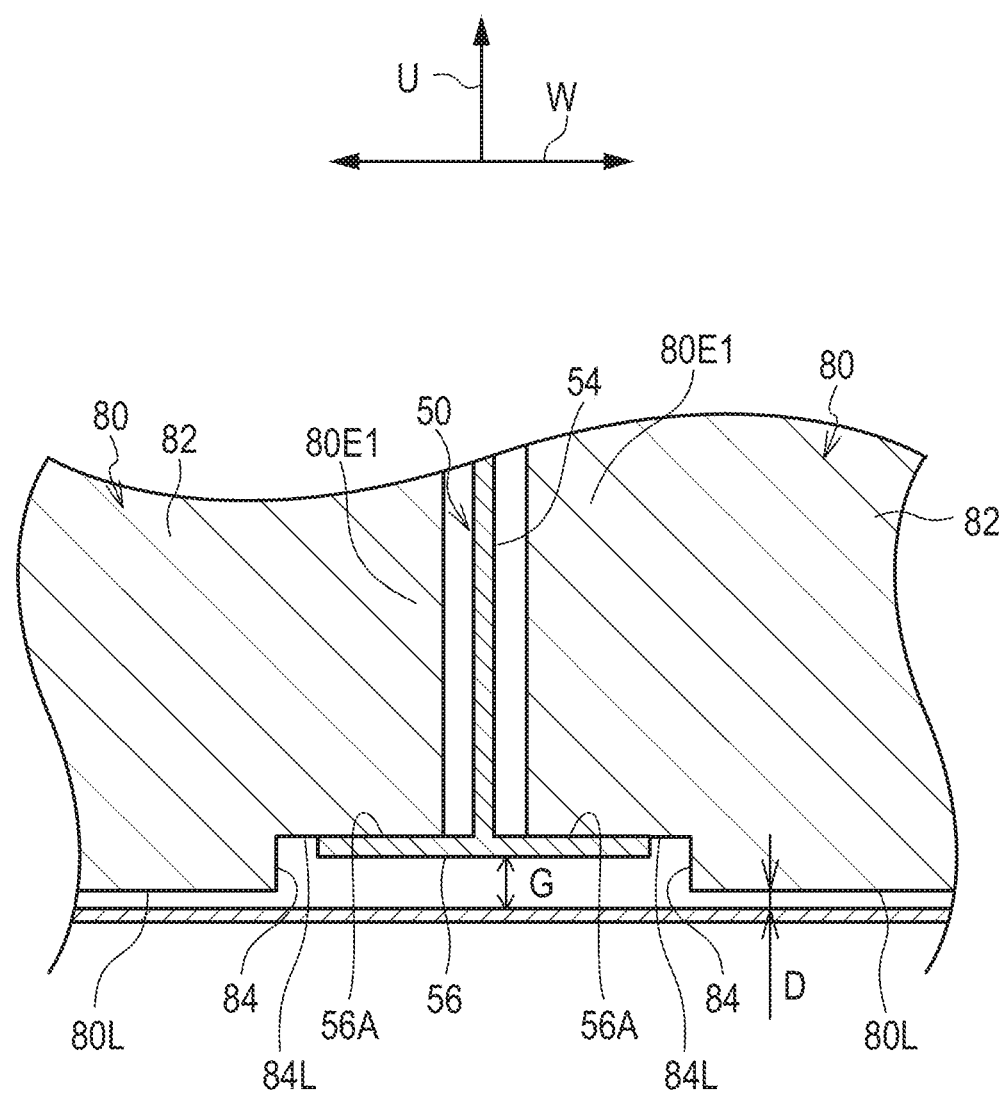
FIG. 7 is an enlarged cross-sectional view illustrating a support portion of a partition member illustrated in FIG. 3.

As illustrated in FIG. 7, the support portion 56 extends from the partition wall portion 54 into the respective containment rooms 44 on both sides. Further, the support portion 56 is disposed with a gap (space) G from the lower wall portion 42L of the case 42. The upper surface of the support portion 56 is a support surface 56A that slidably supports one end 80E1 in the width direction of the electronic unit 80 (to be described later). Then, the electronic unit 80 is contained in the containment room 44 while sliding on the support surface 56A of the support portion 56. That is, the partition member 50 also functions as a guide rail that guides the containment and discharge of the electronic unit 80 with respect to the containment room 44.

[Guide Member]

As illustrated in FIG. 5, a pair of guide members 60 are provided on the outer surfaces of the sidewall portions 42S on both sides of the case 42. The pair of guide members 60 are slidably connected to the pair of guide rails 30 (see FIG. 2) of the rack 20. Thus, the case 42 is contained inside the rack 20 so as to be dischargeable.

The pair of guide members 60 extend in the longitudinal direction of the case 42 and are disposed on both sides in the width direction of the case 42. Further, the pair of guide members 60 are formed of, for example, a metal member. Each guide member 60 includes a base portion 62, an upper connecting portion 64, a lower connecting portion 66, and a plurality of support portions 68. In addition, the upper connecting portion 64 and the lower connecting portion 66 are examples of a connecting portion.

As illustrated in FIG. 3, the base portion 62 is formed in a plate shape. The base portion 62 is joined to the sidewall portion 42S of the case 42 by, for example, the screw 12 (see FIG. 9) in a state where the base portion 62 is superimposed on the outer surface of the sidewall portion 42S. Further, the upper connecting portion 64 is provided on the upper end of the base portion 62. Meanwhile, the lower connecting portion 66 and the support portions 68 are provided on the lower end of the base portion 62.

The upper connecting portion 64 and the lower connecting portion 66 face each other in the height direction of the case 42. Further, the upper connecting portion 64 and the lower connecting portion 66 extend from the base portion 62 to the side opposite to the sidewall portion 42S of the case 42 and are inserted between the pair of flange portions 30A of the guide rail 30. The upper connecting portion 64 and the lower connecting portion 66 are slidably connected to the guide rail 30 via a ball bearing (not illustrated). In addition, FIG. 3 schematically illustrates a ball 69 of the ball bearing.

As illustrated in FIG. 5, the plurality of support portions 68 are arranged at an interval in the longitudinal direction of the guide member 60. Further, the plurality of support portions 68 extend from the lower end of the base portion 62 to the sidewall portion 42S side of the case 42. These support portions 68 are inserted into a plurality of openings 48 formed in a lower portion of the sidewall portion 42S of the case 42.

Figure 8:
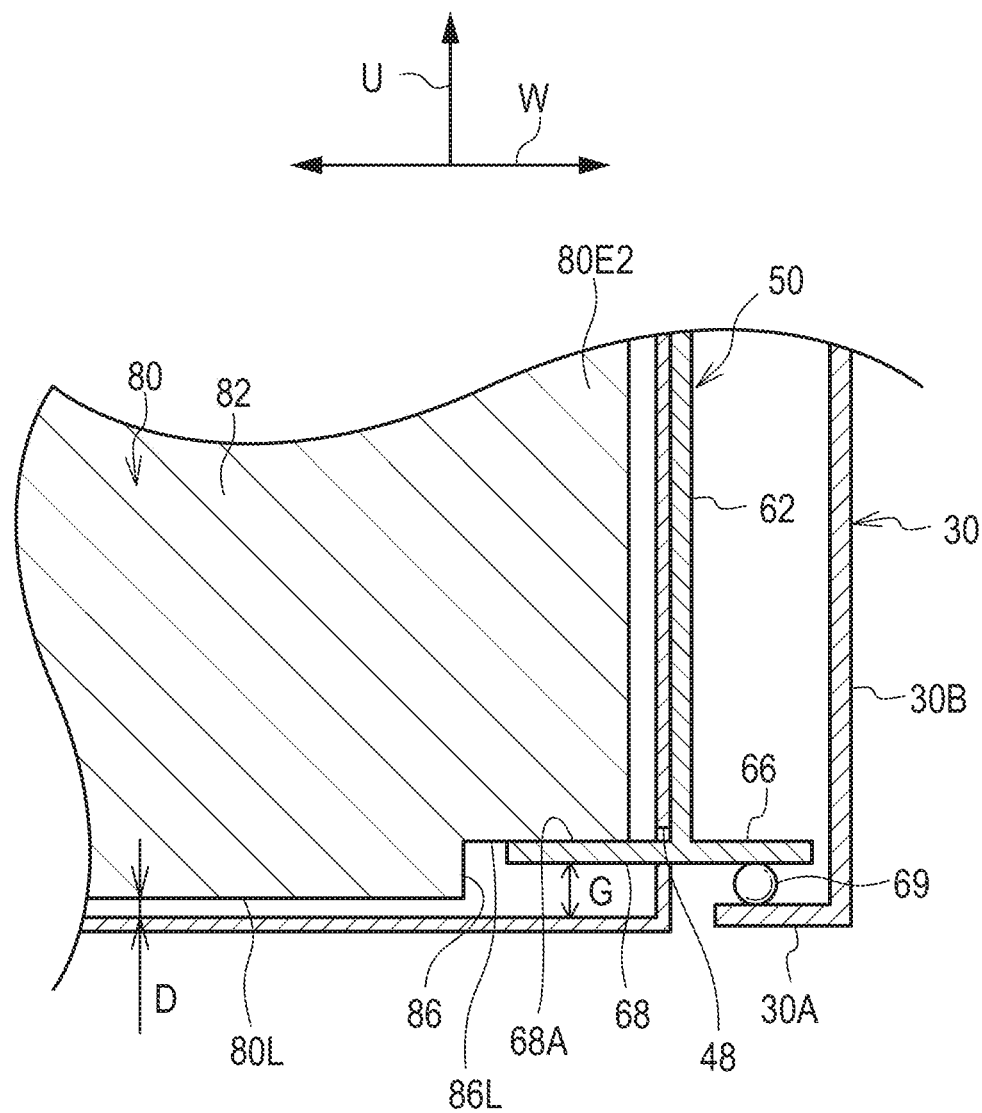
FIG. 8 is an enlarged cross-sectional view illustrating a support portion of a guide member illustrated in FIG. 3.

The plurality of openings 48 are formed in a slit shape to extend in the longitudinal direction of the case 42. Further, the plurality of openings 48 are arranged at an interval in the longitudinal direction of the case 42. The support portions 68 of the guide member 60 are inserted into the respective openings 48. Thus, as illustrated in FIG. 8, the support portions 68 extend from the base portion 62 into the containment room 44 through the openings 48.

Each support portion 68 is disposed with a gap G from the lower wall portion 42L of the case 42. The upper surface of the support portion 68 is a support surface 68A that slidably supports the other end 80E2 in the width direction of the electronic unit 80 (to be described later). Then, the electronic unit 80 is contained in the containment room 44 while sliding on the support surface 68A of the support portion 68. That is, the guide member 60 also functions as a guide rail that guides the containment and discharge of the electronic unit 80 with respect to the containment room 44.

[Connecting Member]

As illustrated in FIG. 2, a connecting member 70 is provided at the center in the longitudinal direction of the case 42. The connecting member 70 is disposed along the width direction of the case 42. As illustrated in FIG. 6, the connecting member 70 is formed in a rectangular frame shape when viewed from the longitudinal direction of the case 42. The connecting member 70 includes a pair of vertical frame portions 70S, an upper horizontal frame portion 70U, and a lower horizontal frame portion 70L. The pair of vertical frame portions 70S, the upper horizontal frame portion 70U, and the lower horizontal frame portion 70L are formed of a metal member having an L-shaped cross section.

Figure 9:
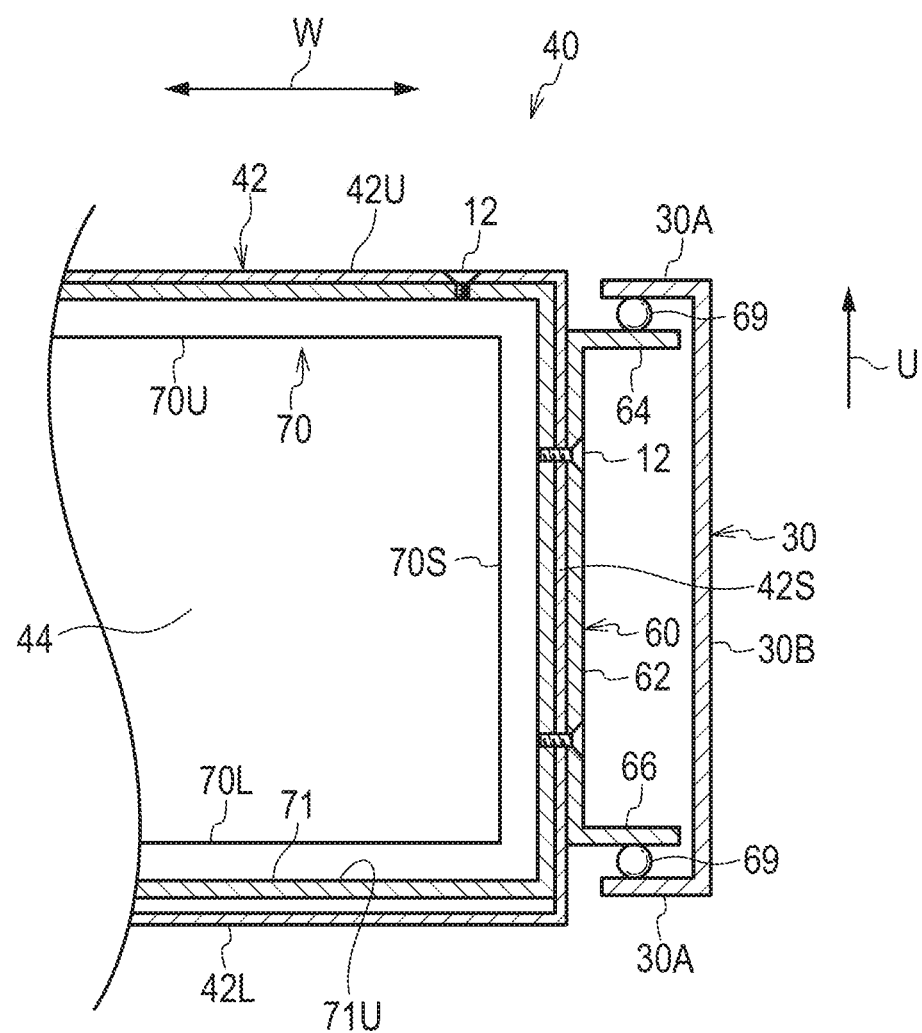
FIG. 9 is a cross-sectional view taken along line 9-9 of FIG. 4.

As illustrated in FIG. 9, the vertical frame portion 70S extends in the height direction of the case 42 and is disposed along the inner surface of the sidewall portion 42S of the case 42. The vertical frame portion 70S is joined to the sidewall portion 42S of the case 42 and the base portion 62 of the guide member 60 by, for example, the screw 12.

As illustrated in FIG. 6, the upper horizontal frame portion 70U extends in the width direction of the case 42 and interconnects the upper ends of the pair of vertical frame portions 70S. Further, the lower horizontal frame portion 70L extends in the width direction of the case 42 and interconnects the lower ends of the pair of vertical frame portions 70S. As illustrated in FIG. 4, by the connecting member 70, the sidewall portions 42S on both sides of the case 42 are connected to each other and the pair of guide members 60 are connected to each other.

Figure 10:
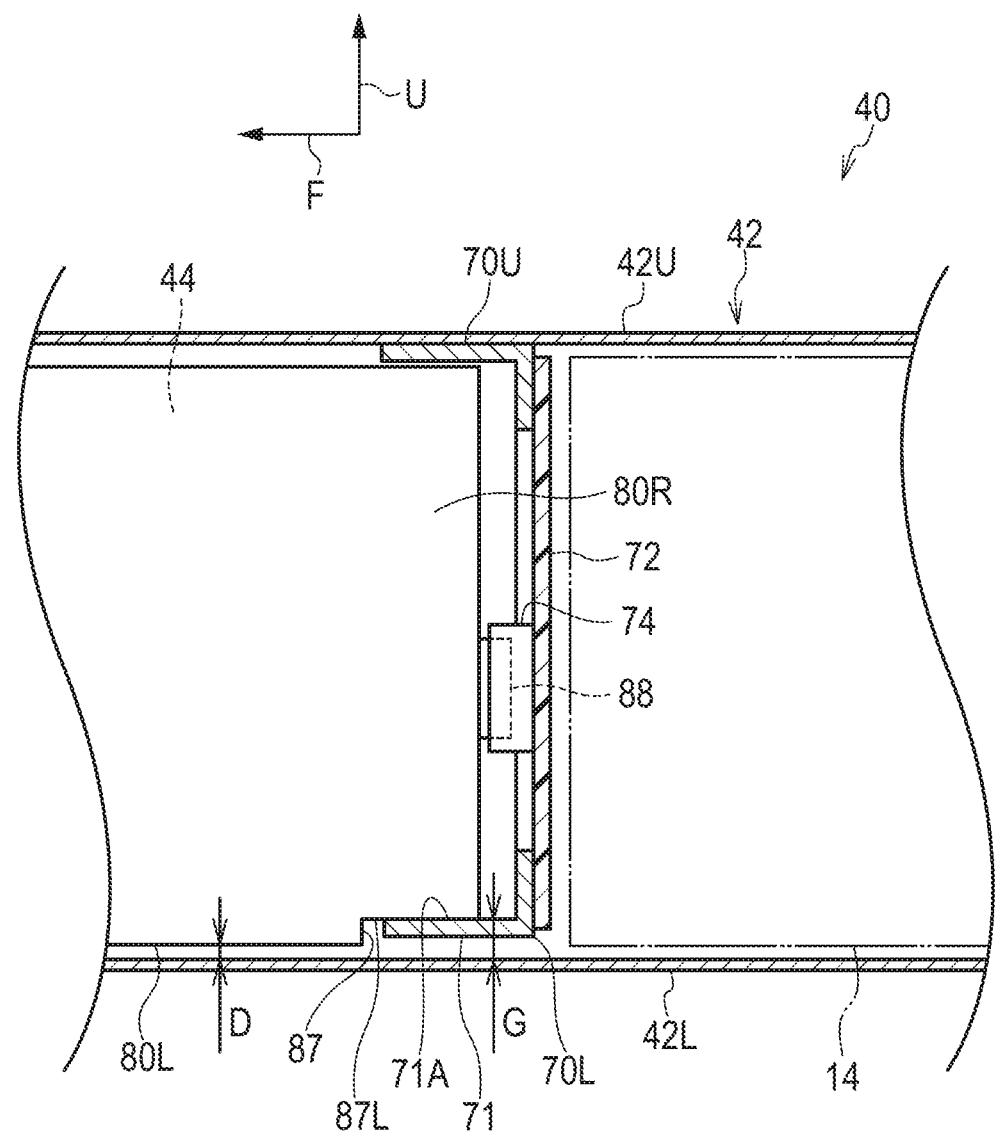
FIG. 10 is a cross-sectional view taken along line 10-10 of FIG. 4.

As illustrated in FIG. 10, the upper horizontal frame portion 70U is joined to the upper wall portion 42U of the case 42 by, for example, the screw 12 (see FIG. 4). The connecting member 70 prevents the bending of the upper wall portion 42U of the case 42. Further, the connecting member 70 is suspended from the upper wall portion 42U of the case 42.

Specifically, the lower horizontal frame portion 70L includes a support portion 71 disposed with a gap (space) G from the lower wall portion 42L of the case 42. The upper surface of the support portion 71 is a support surface 71A that slidably supports the end on the rear side (rear end) 80R of the electronic unit 80.

The connecting member 70 also functions as a frame that holds a substrate 72. Specifically, the substrate 72 as a midplane is attached to the connecting member 70. The substrate 72 is formed in a rectangular shape. The substrate 72 is fixed to the connecting member 70 by, for example, a screw (not illustrated) in a state where the substrate 72 is superimposed on the rear surface of the connecting member 70. Further, a plurality of connectors 74 are mounted on the substrate 72. A connector 88 of the electronic unit 80 is detachably connected to each connector 74.

As illustrated in FIG. 4, the connecting member 70 and the partition member 50 are arranged in a T shape in plan view. Then, a longitudinal end 50E of the partition member 50 is joined to the center in the longitudinal direction of the connecting member 70. The end 50E of the partition member 50 is supported by the connecting member 70.

[Electronic Unit]

As illustrated in FIG. 2, the electronic unit 80 includes a unit case 82 and the connector 88. The unit case 82 is formed in a flat box shape. The electronic unit 80 is contained in the containment room 44 from the containment port 46 of the rack-mounted device 40.

As illustrated in FIG. 3, one end 80E1 in the width direction of the electronic unit 80 is placed on the support surface 56A of the support portion 56 of the partition member 50. Further, the other end 80E2 in the width direction of the electronic unit 80 is placed on the support surface 68A of each support portion 68 of the guide member 60. Thus, the electronic unit 80 is supported by the support portion 56 of the partition member 50 and the support portion 68 of the guide member 60 in a state where the electronic unit 80 is raised from the lower wall portion 42L of the rack-mounted device 40. That is, the electronic unit 80 is supported by the support portion 56 of the partition member 50 and the support portion 68 of the guide member 60 with a gap (space) D from the lower wall portion 42L of the rack-mounted device 40.

Here, step portions 84 and 86 extending in the longitudinal direction of the electronic unit 80 are provided on a lower surface 80L at one end 80E1 and the other end 80E2 of the electronic unit 80, respectively. The step portions 84 and 86 are formed by cutting out the lower corners of one end 80E1 and the other end 80E2 of the electronic unit 80, respectively.

Lower surfaces 84L and 86L of the step portions 84 and 86 are disposed above the lower surface 80L of the electronic unit 80. Then, as illustrated in FIG. 7, the lower surface 84L of the step portion 84 is slidably placed on the support surface 56A of the support portion 56 of the partition member 50. Further, as illustrated in FIG. 8, the lower surface 86L of the step portion 86 is slidably placed on the support surface 68A of the support portion 68 of the guide member 60.

As illustrated in FIG. 10, a step portion 87 extending in the width direction of the electronic unit 80 is provided on the end 80R on the rear side of the electronic unit 80. The step portion 87 is formed by cutting out the lower corner of the end 80R of the electronic unit 80. Further, a lower surface 87L of the step portion 87 is disposed above the lower surface 80L of the electronic unit 80. The lower surface 87L of the step portion 87 is slidably placed on the support surface 71A of the support portion 71 of the connecting member 70.

The connector 88 is provided on the rear surface side of the electronic unit 80. Further, the connector 88 is connected to a substrate (not illustrated) contained in the electronic unit 80. The connector 88 is connected to the connector 74 of the substrate 72 (midplane) held by the connecting member 70 in a state where the electronic unit 80 is contained in the containment room 44.

[Action]

Next, an action of the present embodiment will be described.

Figure 11:
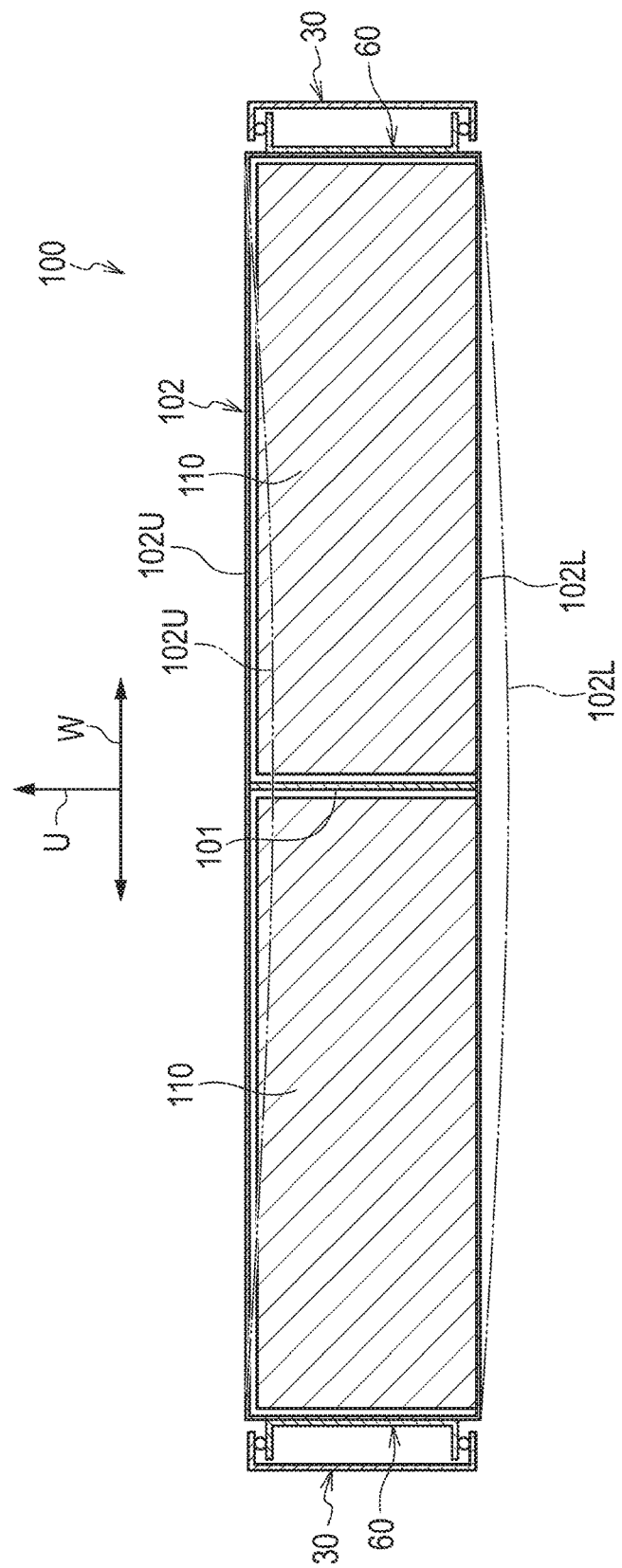
FIG. 11 is a cross-sectional view corresponding to FIG. 3 illustrating a rack-mounted device according to a comparative example.

First, a rack-mounted device according to a comparative example will be described. FIG. 11 illustrates a rack-mounted device 100 according to a comparative example. In the rack-mounted device 100, an upper wall portion 102U and a lower wall portion 102L of a case 102 are connected by a partition member 101.

In the rack-mounted device 100 according to the comparative example, an electronic unit 110 is placed on the lower wall portion 102L of the case 102. In this case, as indicated by a two-dot chain line in FIG. 11, the lower wall portion 102L of the case 102 may bend downward due to the weight of the electronic unit 110. Then, when the lower wall portion 102L of the case 102 bends downward, the lower wall portion 102L may interfere with a rack-mounted device underneath the lower end thereof contained in a rack (not illustrated).

In contrast, in the rack-mounted device 40 according to the present embodiment, as illustrated in FIG. 3, the electronic unit 80 is contained in the containment room 44 of the case 42. One end 80E1 of the electronic unit 80 is supported by the support portion 56 of the partition member 50, and the other end 80E2 of the electronic unit 80 is supported by the support portion 68 of the guide member 60.

Here, the partition member 50 is suspended from the upper wall portion 42U of the case 42. That is, the support portion 56 of the partition member 50 is disposed with the gap G (see FIG. 7) from the lower wall portion 42L of the case 42. Further, the support portion 68 of the guide member 60 is disposed with the gap G (see FIG. 8) from the lower wall portion 42L of the case 42. Thus, the load of the electronic unit 80 applied to the lower wall portion 42L of the case 42 from the support portions 56 and 68 is reduced. Thus, the bending of the lower wall portion 42L of the case 42 is reduced. As a result, the lower wall portion 42L of the case 42 is prevented from interfering with the rack-mounted device 40 (see FIG. 1) on the lower end thereof.

Further, the support portion 56 of the partition member 50 and the support portion 68 of the guide member 60 support the electronic unit 80 in a state where the electronic unit 80 is raised from the lower wall portion 42L of the case 42. That is, the support portion 56 of the partition member 50 and the support portion 68 of the guide member 60 support the electronic unit 80 in a state where a gap D (see FIGS. 7 and 8) is provided between the lower wall portion 42L of the case 42 and the electronic unit 80. Thus, the load of the electronic unit 80 is prevented from being applied to the lower wall portion 42L of the case 42. Thus, the bending of the lower wall portion 42L of the case 42 is prevented.

Furthermore, as illustrated in FIG. 8, the guide members 60 are provided on the outer surfaces of the sidewall portions 42S on both sides of the case 42. Each guide member 60 is slidably connected to the guide rail 30 of the rack 20. The support portion 68 is provided on the guide member 60. Thus, the electronic unit 80 is supported on the guide rail 30 of the rack 20 via the support portion 68 and the guide member 60. Thus, the electronic unit 80 may be supported in a more stable state by the support portion 68.

Further, as illustrated in FIG. 3, the step portions 84 and 86 are provided on one end 80E1 and the other end 80E2 of the electronic unit 80, respectively. By these step portions 84 and 86, an installation space for the support portions 56 and 68 is secured below one end 80E1 and the other end 80E2 of the electronic unit 80. Thus, the height of the center in the width direction of the electronic unit 80 may be made high.

By the way, when the electronic unit 80 is supported by the support portion 68 provided on the sidewall portion 42S of the case 42, the load of the electronic unit 80 is transmitted to the sidewall portion 42S of the case 42 via the support portion 68. In this case, the sidewall portion 42S of the case 42 may be deformed.

As a countermeasure, in the present embodiment, as illustrated in FIGS. 8 and 9, the guide member 60 is provided on the outer surface of the sidewall portion 42S of the case 42. The guide member 60 includes the base portion 62 superimposed on the outer surface of the sidewall portion 42S of the case 42. The sidewall portion 42S of the case 42 is reinforced by the base portion 62.

Furthermore, the base portion 62 is provided with the upper connecting portion 64 and the lower connecting portion 66. The upper connecting portion 64 and the lower connecting portion 66 extend from the base portion 62 to the side opposite to the sidewall portion 42S of the case 42. The upper connecting portion 64 and the lower connecting portion 66 also function as reinforcement ribs that reinforce the base portion 62. Thus, the reinforcement effect of the sidewall portion 42S of the case 42 may be enhanced by the base portion 62. Thus, for example, deformation of the sidewall portion 42S of the case 42 is further prevented.

Further, as illustrated in FIG. 4, the connecting member 70 is disposed on the back side of the containment room 44 of the case 42. The connecting member 70 interconnects the sidewall portions 42S on both sides of the case 42 and interconnects the guide members 60 on both sides. The connecting member 70 also reinforces the sidewall portions 42S of the case 42. Thus, for example, deformation of the sidewall portions 42S of the case 42 is further prevented.

Further, as described above, in the present embodiment, as illustrated in FIG. 3, one end 80E1 of the electronic unit 80 is supported by the partition member 50 suspended from the upper wall portion 42U of the case 42. Therefore, the load of the electronic unit 80 is transmitted to the upper wall portion 42U of the case 42 via the partition member 50. In this case, the upper wall portion 42U of the case 42 may bend.

As a countermeasure, in the present embodiment, as illustrated in FIG. 10, the connecting member 70 is joined to the upper wall portion 42U of the case 42. Thus, the upper wall portion 42U of the case 42 is supported by the sidewall portions 42S on both sides of the case 42 and the pair of guide members 60 via the connecting member 70. Thus, the bending of the upper wall portion 42U of the case 42 is prevented.

Furthermore, as illustrated in FIG. 4, the end 50E of the partition member 50 is joined to the connecting member 70. Thus, the partition member 50 is supported by the sidewall portions 42S on both sides of the case 42 and the pair of guide members 60 via the connecting member 70. Thus, the bending of the upper wall portion 42U of the case 42 is prevented.

Further, as illustrated in FIG. 10, the end 8R on the rear side of the electronic unit 80 is supported by the support portion 71 of the lower horizontal frame portion 70L of the connecting member 70. The connecting member 70 is suspended from the upper wall portion 42U of the case 42. That is, the connecting member 70 is disposed with the gap G from the lower wall portion 42L of the case 42. Thus, the end 80R on the rear side of the electronic unit 80 is supported by the sidewall portions 42S on both sides of the case 42 and the pair of guide members 60 via the connecting member 70. Thus, the bending of the upper wall portion 42U of the case 42 is prevented, and the bending of the lower wall portion 42L of the case 42 is also prevented.

Further, the step portion 87 is provided on the end 80R on the rear side of the electronic unit 80. By the step portion 87, an installation space for the support portion 71 of the connecting member 70 is secured below the end 80R of the electronic unit 80. Thus, the height of the center in the longitudinal direction of the electronic unit 80 may be made high.

Furthermore, the connecting member 70 holds the substrate 72. That is, the connecting member 70 is also used as a frame that holds the substrate 72. Thus, the number of parts of the rack-mounted device 40 is reduced.

[Modification]

Next, a modification of the above embodiment will be described.

Figure 12:
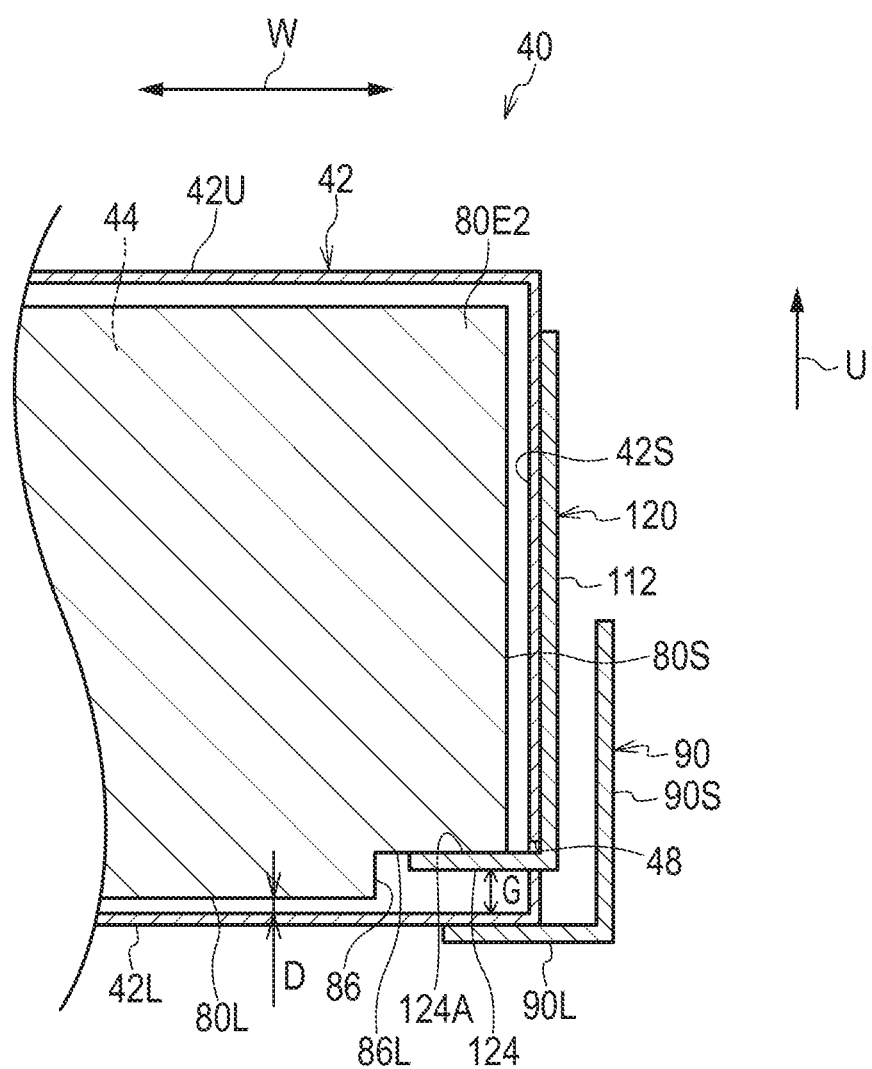
FIG. 12 is a cross-sectional view corresponding to FIG. 8 illustrating a modification of the rack-mounted device according to the embodiment.

In the above embodiment, the guide member 60 of the rack-mounted device 40 is slidably connected to the guide rail 30 of the rack 20. However, for example, as illustrated in FIG. 12, a guide member 120 may not be coupled to a guide rail 90.

Specifically, the guide rail 90 is formed of a metal member having an L-shaped cross section. The guide rail 90 includes a side surface guide portion 90S and a lower surface guide portion 90L. The side surface guide portion 90S is disposed along the height direction of the rack 20. The lower surface guide portion 90L is provided on the lower end of the side surface guide portion 90S. The lower surface guide portion 90L extends from the lower end of the side surface guide portion 90S to the center side in the width direction of the rack 20. The lower surface of the lower wall portion 42L of the case 42 is slidably placed on the upper surface of the lower surface guide portion 90L.

The guide member 120 is provided on the outer surface of the sidewall portion 42S of the case 42. Further, the guide member 120 is formed of a metal member having an L-shaped cross section. The guide member 120 includes a base portion 122 and a support portion 124. The base portion 122 is joined to the sidewall portion 42S of the case 42 by, for example, a screw (not illustrated) in a state where the base portion 122 is superimposed on the outer surface of the sidewall portion 42S of the case 42. The sidewall portion 42S of the case 42 is reinforced by the base portion 122.

The support portion 124 is provided on the lower end of the base portion 122. The support portion 124 extends from the lower end of the base portion 122 into the containment room 44 through the opening 48 formed in the sidewall portion 42S of the case 42. The lower surface 86L of the step portion 86 of the electronic unit 80 is slidably placed on a support surface 124A of the support portion 124. As described above, the electronic unit 80 may be supported by the support portion 124 of the guide member 120 which is not connected to the guide rail 90.

Further, in the above embodiment, the lower surfaces 84L, 86L and 87L of the step portions 84, 86 and 87 of the electronic unit 80 are supported by the support portions 56, 68 and 71 of the partition member 50, the guide member 60, and the connecting member 70. However, the step portions 84, 86 and 87 may be omitted. In this case, the lower surface 80L of the electronic unit 80 is supported by, for example, the support portions 56, 68 and 71 of the partition member 50, the guide member 60, and the connecting member 70.

Figure 13:
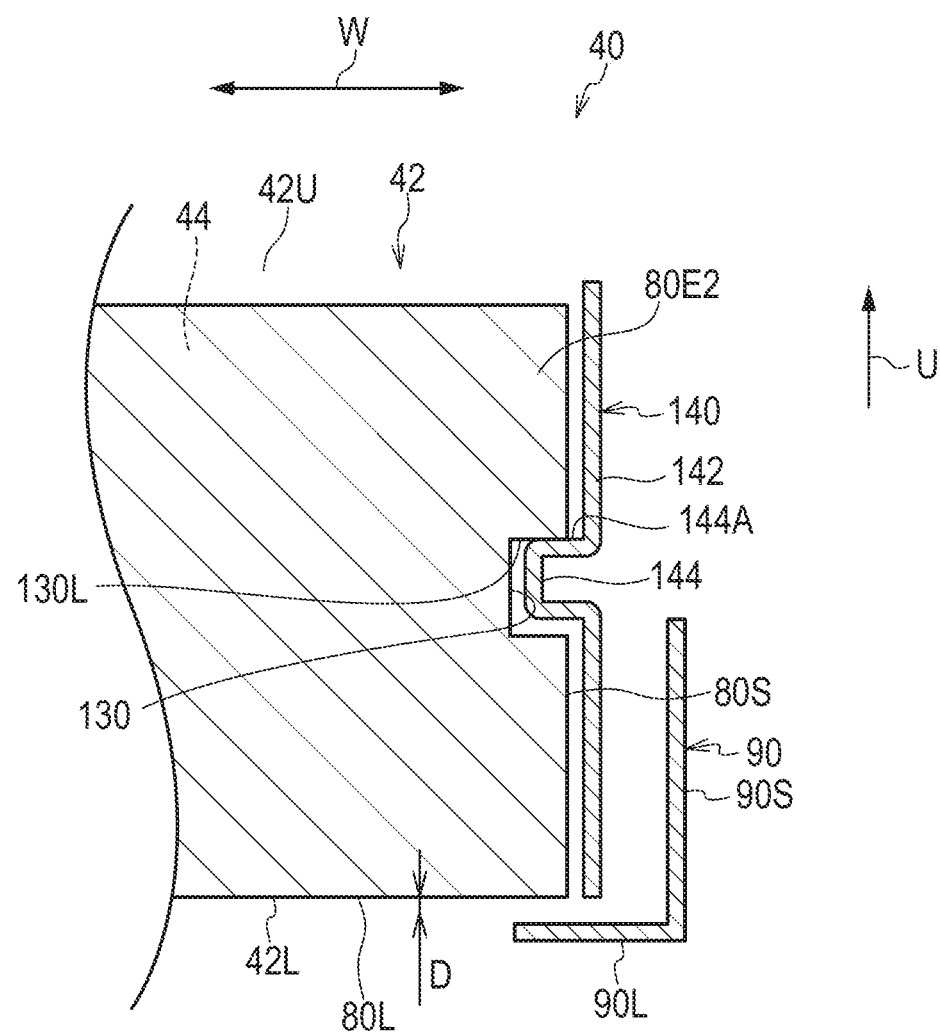
FIG. 13 is a cross-sectional view corresponding to FIG. 8 illustrating a modification of the rack-mounted device according to the embodiment.

Next, in a modification illustrated in FIG. 13, a groove 130 extending in the longitudinal direction of the case 42 is formed in a side surface 80S of the other end 80E2 of the electronic unit 80. Meanwhile, a guide member 140 is provided on the inner surface of the sidewall portion 42S of the case 42. The guide member 140 includes a base portion 142 and a support portion 144.

The base portion 142 is superimposed on the inner surface of the sidewall portion 42S of the case 42. The base portion 142 is joined to the sidewall portion 42S of the case 42 by, for example, a screw (not illustrated). The support portion 144 extends in the longitudinal direction of the case 42, protrudes into the containment room 44 from the center of the base portion 142 to have a protrusion shape, and is slidably inserted into the groove 130 of the case 42.

The upper surface of the support portion 144 is a support surface 144A that slidably supports the surface 130L on the upper side of the groove 130. The support portion 144 supports the electronic unit 80 in a state where the electronic unit 80 is raised from the lower wall portion 42L of the case 42, i.e., in a state where the gap D is provided between the electronic unit 80 and the lower wall portion 42L of the case 42. Thus, the same effect as in the above embodiment may be acquired.

In addition, although not illustrated, a groove similar to the groove 130 illustrated in FIG. 13 may be formed in the side surface of one end 80E1 of the electronic unit 80. In this case, for example, the partition member 50 is provided with a support portion similar to the support portion 144 of the guide member 140 illustrated in FIG. 13.

Further, a support portion extending from the sidewall portion 42S of the case 42 to the containment room side may be formed by, for example, a cut-and-raised portion of the sidewall portion 42S that is partially cut and raised to the containment room 44 side.

Next, in the above embodiment, the support portion 56 is provided on the lower end of the partition wall portion 54 of the partition member 50. However, the support portion 56 may be provided above the lower end of the partition wall portion 54.

Further, in the above embodiment, the case 42 is provided with two containment rooms 44. However, the case 42 may be provided with two or more containment rooms 44. Further, the plurality of containment rooms 44 may not be limited to the front side of the case 42 but may also be provided on the rear side of the case 42. Furthermore, the plurality of containment rooms 44 may be provided on both the front and rear sides of the case 42.

Further, in the above embodiment, the end 80R on the rear side of the electronic unit 80 is supported by the connecting member 70. However, the connecting member 70 may not support the electronic unit 80. Further, in the above embodiment, the connecting member 70 is suspended from the upper wall portion 42U of the case 42. However, the connecting member 70 may be supported by the lower wall portion 42L of the case 42, rather than being suspended from the upper wall portion 42U of the case 42.

Further, the connecting member 70 of the above embodiment is provided at the central in the longitudinal direction of the case 42. However, the connecting member may be provided on, for example, the rear side of the case 42. In addition, for example, a substrate as a backplane is attached to the connecting member disposed on the rear side of the case 42. Furthermore, the connecting member may be omitted.

Further, the above embodiment may be applied to devices other than the rack-mounted device 40 as appropriate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:
1. A rack-mounted device comprising:
 a case configured to include, in a width direction, a plurality of containment rooms each in which an electronic device is contained;
 a partition suspended from an upper wall of the case and configured to partition off the plurality of containment rooms adjacent to each other and guide the electronic device;
 a support plate extending from a sidewall of the case into a containment room of the plurality of containment rooms and provided with a gap from a lower wall of the case to support the electronic device; and a first connector provided in an area of a back side of the plurality of containment rooms in the width direction of the case to interconnect sidewalls of the case on both sides, wherein a side step is provided at each of both ends of the electronic device in the width direction of a bottom portion of the electronic device, a rear step is provided at a rear end of the bottom portion of the electronic device, and the first connector is joined to a lower surface of the upper wall of the case and a lower end thereof is inserted into the rear step of the electronic device.

2. The rack-mounted device according to claim 1, wherein the partition and the support plate support the electronic device in a state where the electronic device is raised from the lower wall of the case.

3. The rack-mounted device according to claim 1, wherein the partition and the support plate slidably support the electronic device.

4. The rack-mounted device according to claim 1, wherein the electronic device is contained in the containment room along the partition and the support plate.

5. The rack-mounted device according to claim 1, wherein the partition and the support plate support both ends of the electronic device, respectively, in the width direction.

6. The rack-mounted device according to claim 1, wherein the partition is provided with a gap from the lower wall of the case.

7. The rack-mounted device according to claim 1, further comprising:

a guide provided over an outer surface of the sidewall of the case, wherein the support plate is provided over the guide and extends from the guide into the containment room through the sidewall of the case.

8. The rack-mounted device according to claim 7, wherein the guide is coupled to a guide rail provided in a rack in which the case is mounted.

9. The rack-mounted device according to claim 8, wherein the guide includes a base provided over the outer surface of the sidewall, and wherein the support plate is provided over the base.

10. The rack-mounted device according to claim 9, wherein the guide includes a portion extending from the base to a side opposite to a direction of the sidewall and slidably coupled to the guide rail.

11. The rack-mounted device according to claim 1, wherein the partition is joined to the first connector.

12. The rack-mounted device according to claim 11, wherein the first connector is provided with a gap from the lower wall of the case and configured to support the electronic device.

13. The rack-mounted device according to claim 11, wherein the first connector slidably supports the lower surface of the electronic device.

14. The rack-mounted device according to claim 11, wherein the first connector includes:

a pair of vertical frames provided along inner surfaces of the sidewalls over both sides of the case;

an upper horizontal frame that interconnects upper ends of the pair of vertical frames and is joined to the lower surface of the upper wall of the case; and a lower horizontal frame that interconnects lower ends of the pair of vertical frames and serves as the lower end of the first connector.

15. The rack-mounted device according to claim 11, further comprising:

a substrate held by the first connector and configured to have a second connector coupled to the electronic device.

16. The rack-mounted device according to claim 1, wherein the support plate is slidably inserted into the step.

17. The rack-mounted device according to claim 1, wherein each end in the width direction of the electronic device is provided with a groove into which the support plate is slidably inserted.

18. The rack-mounted device according to claim 1, wherein the partition includes:

a flange joined to the upper wall of the case, a partition wall extending downward from the flange, and a lower support extending from the partition wall into the containment room to support the electronic device.

19. The rack-mounted device according to claim 1, wherein the side step of the electronic device extends in a longitudinal direction of the electronic device, and the rear step of the electronic device extends in the width direction of the electronic device.

20. An electronic apparatus comprising:

a rack;

a case contained in the rack and configured to include, in a width direction, a plurality of containment rooms each in which an electronic device is contained;

a partition suspended from an upper wall of the case and configured to partition off the plurality of containment rooms adjacent to each other and guide the electronic device;

a support plate extending from a sidewall of the case into a containment room of the plurality of rooms and provided with a gap from a lower wall of the case to support the electronic device; and a first connector provided in an area of a back side of the plurality of containment rooms in the width direction of the case to interconnect sidewalls of the case on both sides, wherein a side step is provided at each of both ends of the electronic device in the width direction of a bottom portion of the electronic device, a rear step is provided at a rear end of the bottom portion of the electronic device, and the first connector is joined to a lower surface of the upper wall of the case and a lower end thereof is inserted into the rear step of the electronic device.

\* \* \* \* \*